(12) United States Patent
Mathe et al.

(10) Patent No.: US 9,306,520 B2
(45) Date of Patent: Apr. 5, 2016

(54) REVERSE CURRENT PREVENTION

(71) Applicant: QUALCOMM Incorporated, San Diego, CA (US)

(72) Inventors: Lennart Karl-Axel Mathe, San Diego, CA (US); Joseph D Rutkowski, Chandler, AZ (US); Song S Shi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 549 days.

(21) Appl. No.: 13/752,241

(22) Filed: Jan. 28, 2013

(65) Prior Publication Data

US 2014/0210550 A1    Jul. 31, 2014

(51) Int. Cl.
*H03G 3/20* (2006.01)
*H03G 1/00* (2006.01)
*H03F 1/02* (2006.01)

(52) U.S. Cl.
CPC ........... *H03G 1/0005* (2013.01); *H03F 1/0238* (2013.01)

(58) Field of Classification Search
CPC ............... H02M 3/156–3/158; H03G 1/0005; H03F 1/0238
USPC ........... 323/271–273, 282–285; 330/127, 136
See application file for complete search history.

(56) References Cited

U.S. PATENT DOCUMENTS

| | | | |
|---|---|---|---|
| 6,091,297 A | 7/2000 | Bar-David et al. | |
| 6,437,641 B1 | 8/2002 | Bar-David | |
| 6,492,867 B2 | 12/2002 | Bar-David | |
| 6,498,466 B1 * | 12/2002 | Edwards | 323/282 |
| 6,831,519 B2 | 12/2004 | Bar-David et al. | |
| 6,985,039 B2 | 1/2006 | Bar-David et al. | |
| 7,046,090 B2 | 5/2006 | Veinblat | |
| 7,257,384 B2 | 8/2007 | Bar-David et al. | |
| 7,282,894 B2 * | 10/2007 | Oswald et al. | 323/224 |
| 7,710,203 B2 | 5/2010 | Bar-David et al. | |
| 7,755,431 B2 * | 7/2010 | Sun | 330/297 |
| 7,782,132 B2 | 8/2010 | Plotnik et al. | |
| 7,808,323 B2 * | 10/2010 | Takinami et al. | 330/297 |
| 7,899,417 B2 | 3/2011 | Elia | |
| 7,932,780 B2 | 4/2011 | Elia | |
| 8,107,902 B2 | 1/2012 | Elia | |

(Continued)

OTHER PUBLICATIONS

Choi, et al., "A New Power Management IC Architecture for Envelope Tracking Power Amplifier," IEEE Transactions on Microwave Theory and Techniques, vol. 59, No. 7, Jul. 2011, pp. 1796-1802.

(Continued)

*Primary Examiner* — Timothy J Dole
*Assistant Examiner* — Shahzeb K Ahmad
(74) *Attorney, Agent, or Firm* — Arent Fox LLP (57) ABSTRACT

Techniques for preventing reverse current in applications wherein a tracking supply voltage is placed in parallel with a switching power stage. The tracking supply voltage may be boosted to a level higher than a battery supply voltage using, e.g., a boost converter. In an aspect, a negative current detection block is provided to detect negative current flow from the boosted tracking supply voltage to the battery supply voltage. A high-side switch of the switching power stage may be disabled in response to detecting the negative current. To prevent false tripping, the tracking supply voltage may be further compared with the battery supply voltage, and a latch may be provided to further control the high-side switch.

18 Claims, 10 Drawing Sheets

(56) References Cited

U.S. PATENT DOCUMENTS

| | | |
|---|---|---|
| 8,193,860 B2 | 6/2012 | Cohen |
| 8,237,499 B2 | 8/2012 | Chen et al. |
| 8,957,648 B2 * | 2/2015 | Wakii et al. .................. 323/282 |
| 2008/0111529 A1 * | 5/2008 | Shah et al. .................. 323/283 |
| 2009/0098846 A1 | 4/2009 | Elia |
| 2009/0243568 A1 * | 10/2009 | Nguyen ....................... 323/274 |
| 2011/0279180 A1 | 11/2011 | Yamanouchi et al. |
| 2012/0194274 A1 | 8/2012 | Fowers et al. |
| 2012/0326783 A1 | 12/2012 | Mathe et al. |
| 2013/0193941 A1 * | 8/2013 | DeFazio ....................... 323/282 |
| 2013/0207731 A1 * | 8/2013 | Balteanu ...................... 330/296 |

OTHER PUBLICATIONS

International Search Report and Written Opinion—PCT/US2014/012391—ISA/EPO—Apr. 9, 2014.

Liu J., et al., An Envelope Tracking H-Bridged Audio Amplifier With Improved Efficiency and THD Less Than 0.1 %, 2012 25th IEEE Canadian Conference on Electrical and Computer Engineering (CCECE), IEEE, Apr. 29, 2012, pp. 1-4, XP032256990, DO1 : 10.1109/CCECE.2012.6334867 ISBN: 978-1-4673-1431-2 figure 2.

* cited by examiner

FIG 9

REVERSE CURRENT PREVENTION

BACKGROUND

1. Field

The disclosure relates to envelope tracking for power amplifiers.

2. Background

Envelope tracking is a technique for increasing the efficiency of power amplifiers. In an envelope tracking (ET) system, the supply voltage of a power amplifier is dynamically adjusted to keep the power amplifier operating with sufficient headroom to maintain linearity, while nevertheless minimizing DC power consumption. The supply voltage of the power amplifier (or "tracking supply voltage") may be generated using a separate linear amplifier that tracks the envelope of the power amplifier output. In certain implementations, the linear amplifier is itself coupled to an amplifier supply voltage generated by a boost converter, which is capable of generating a boosted supply voltage for the linear amplifier that exceeds the maximum supply voltage otherwise available to the system, e.g., from a battery of the system. In this manner, the power amplifier output can reach and even exceed the battery supply voltage when necessary. The tracking supply voltage may further be coupled to a switching power stage to provide greater driving capability to the power amplifier.

In certain cases wherein the battery supply voltage is low, and the power amplifier is called on to deliver a high peak power level, the tracking supply voltage may exceed the battery supply voltage. This may lead to a condition known as "reverse current flow," wherein current flows from the tracking supply voltage through a high-side switch of the switching power stage back to the battery supply voltage. Reverse current flow undesirably degrades system efficiency, and requires the boost converter to be significantly over-designed. Furthermore, reverse current flow may introduce distortion into the power amplifier output, causing the output waveform to potentially violate linearity and RX band noise specifications.

It would be desirable to provide techniques for detecting and preventing reverse current flow in an envelope tracking system.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Note in this specification and in the claims, the denotation of a signal or voltage as being "high" or "low" may refer to such signal or voltage being in a logical "high" or "low" state, which may (but need not) correspond to a "TRUE" (e.g., =1) or "FALSE" (e.g., =0) state for the signal or voltage. It will be appreciated that one of ordinary skill in the art may readily modify the logical conventions described herein, e.g., substitute "high" for "low" and/or "low" for "high," to derive circuitry having functionality substantially equivalent to that described herein. Such alternative exemplary embodiments are contemplated to be within the scope of the present disclosure.

Figure 1:
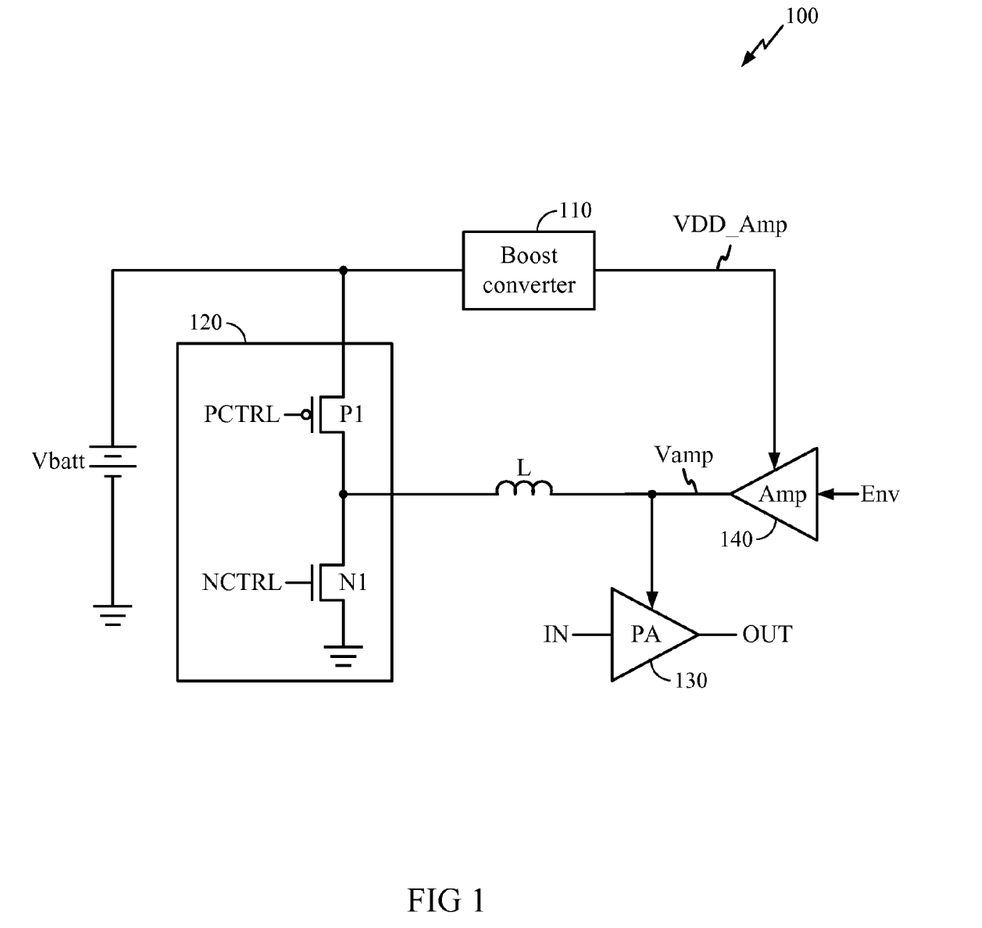
FIG. 1 illustrates an implementation of an envelope tracking (ET) system.

FIG. 1 illustrates an implementation of an envelope tracking (ET) system 100. Note FIG. 1 is shown for illustrative purposes only, and is not meant to limit the scope of the present disclosure to any particular implementation of an ET system. For example, the techniques described hereinbelow may readily be applied to systems incorporating alternative or additional modules not shown in FIG. 1.

In FIG. 1, a power amplifier (PA) 130 receives one or more input voltages IN and generates one or more amplified output voltages OUT. Note in general, IN and/or OUT may each include a plurality of voltages, e.g., in-phase (I) and quadrature (Q) signal voltages, etc. The PA 130 may further have a digital interface (not shown in FIG. 1) to change the gain settings of the PA 130. A voltage Vamp, also denoted a "tracking supply voltage," is provided to the PA 130 as a supply voltage. Vamp is generated at least in part by an amplifier 140. The amplifier 140 is supplied by a voltage VDD_Amp, also denoted an "amplifier supply voltage" or a "boosted supply voltage." In certain implementations of an ET system, to generate Vamp, the amplifier 140 may amplify a voltage Env which tracks the envelope of the PA output voltage OUT. Note amplifier 140 may generally be any type of amplifier known in the art, e.g., class A, class B, class AB, etc. Such exemplary embodiments are contemplated to be within the scope of the present disclosure.

In certain operating scenarios, to maintain sufficient headroom for the PA, it may be necessary to drive Vamp to a level that exceeds the level of Vbatt, which is a maximum supply voltage otherwise available to the system, e.g., a supply voltage from a battery of the system. Vbatt may also be denoted herein as a "battery supply voltage," and such battery supply voltage may generally be supplied by any type of device for supplying power, e.g., lithium-ion battery, other linear or switching voltage regulators, direct AC line, etc. To allow the amplifier 140 to generate an output Vamp that is higher than Vbatt, a boost converter 110 may be provided to generate VDD_Amp. The boost converter 110 may boost VDD_Amp to a higher level than Vbatt according to principles of operation not shown in FIG. 1 but known in the art, e.g., using a plurality of switches alternately configured to charge and discharge a boost inductor (not shown) to generate a boosted voltage.

The tracking supply voltage Vamp provided to the PA 130 may be maintained at a level sufficient to ensure linear operation of the PA 130, i.e., provided with sufficient "headroom," while reducing unnecessary DC power consumption. In FIG. 1, a switching power stage 120 is further coupled to the PA 130 at Vamp to increase the power driving capability of the PA 130. The switching power stage 120 includes transistor switches P1, N1 coupled to gate control voltages PCTRL, NCTRL respectively, wherein the switches P1, N1 are configured to alternately couple an inductor L to Vbatt or to ground.

Note while switches P1, N1 are shown as transistor implementations in this specification, it will be appreciated that in general, other types of switches, e.g., relays, etc., may be configured using the techniques of the present disclosure. In particular, P1 and N1 may also be generally denoted as corresponding to a "high-side switch" and a "low-side switch," respectively. Furthermore, note in certain exemplary embodiments, the high-side switch need not be implemented using a PMOS transistor, and may instead be implemented using an NMOS transistor. Such alternative exemplary embodiments are contemplated to be within the scope of the present disclosure.

Figure 2:
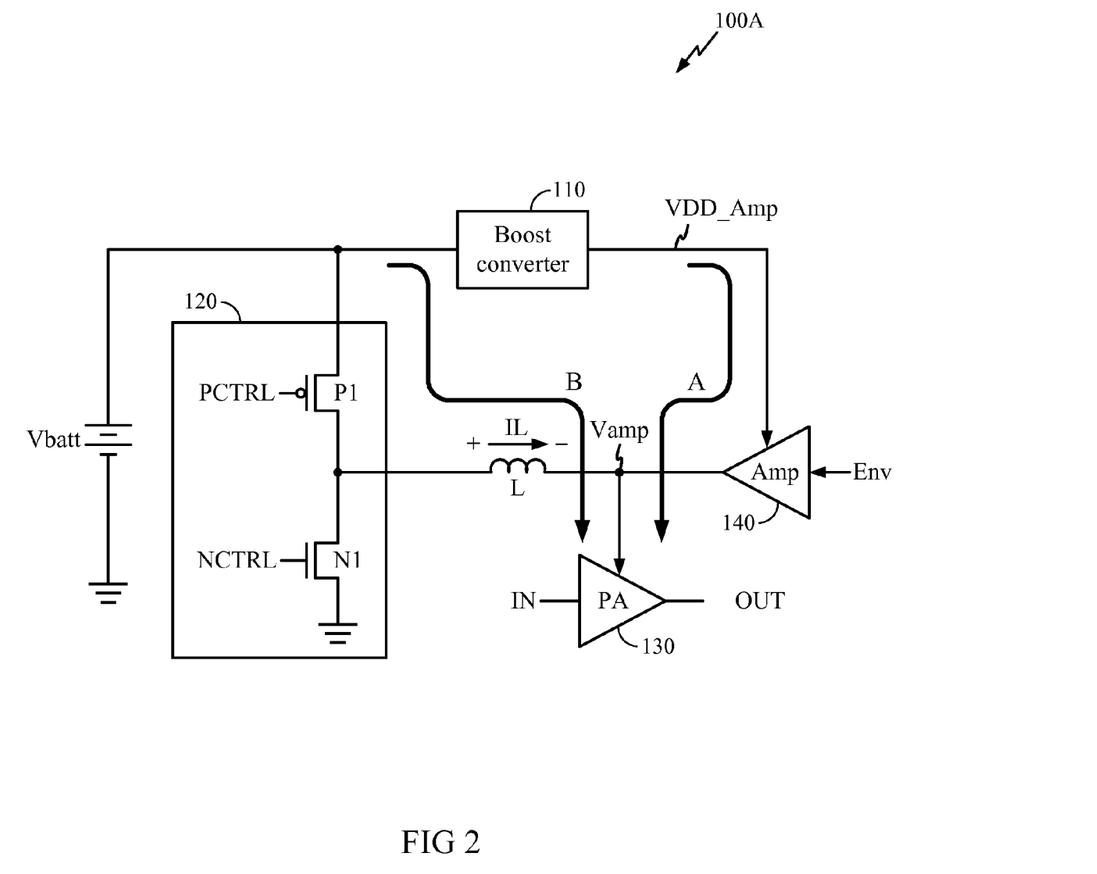
FIG. 2 illustrates an operating scenario showing normal operation of the ET system.
Figure 3:
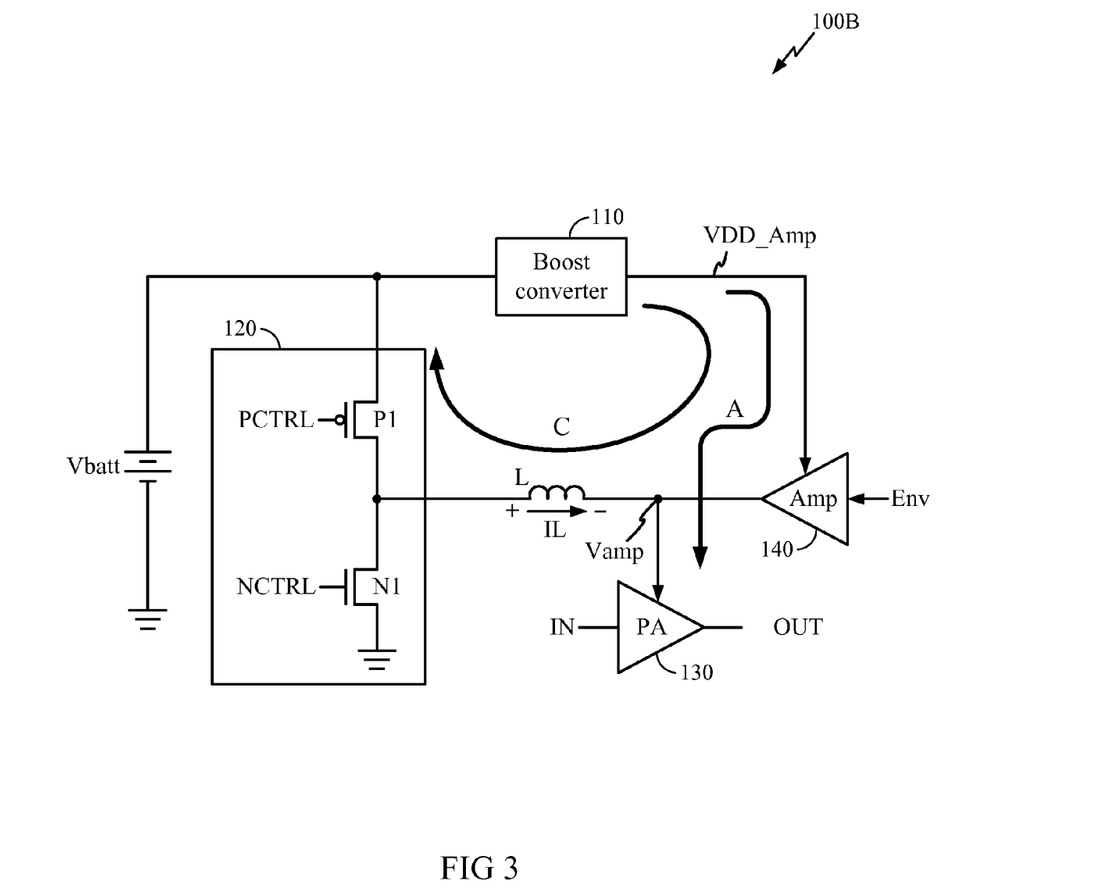
FIG. 3 illustrates an operating scenario wherein there is "reverse current" or "reverse current flow" present in the ET system.

FIGS. 2 and 3 illustrate operating scenarios for the ET system 100, depicting certain principles according to the present disclosure. Note FIGS. 2 and 3 are shown for illustrative purposes only, and are not meant to limit the scope of the present disclosure.

In particular, FIG. 2 illustrates an operating scenario 100A showing normal operation of the ET system 100. In FIG. 2, both the amplifier 140 and the switching power stage 120 may source current into the PA 130. For example, in FIG. 2, current sourced to the PA 130 by the amplifier 140 from the boost converter 110 is shown by an arrow marked A, while current sourced to the PA 130 by the switching power stage 120 from Vbatt is shown by an arrow marked B. The operating scenario 100A may arise, e.g., when Vamp is less than Vbatt.

FIG. 3 illustrates an operating scenario 100B wherein there is "reverse current" or "reverse current flow" present in the ET system 100. In particular, when a voltage peak occurs in IN, the level of Vamp may be driven higher by amplifier 140 to provide sufficient headroom for the PA 130. In some cases wherein Vbatt is low, Vamp may eventually be driven to a level higher than Vbatt, due to the boosted amplifier supply voltage VDD_Amp provided by the boost converter 110. When Vamp exceeds Vbatt, current IL through the inductor L (whose directionality is as indicated in FIG. 2) begins to decrease. Eventually, the inductor current may reverse in direction and become negative, in which case the boost converter 110 effectively sources current from the amplifier 140 to Vbatt via switch P1. This "reverse current" is shown by the arrow marked C. The amount of time such "reverse current" is present in the ET system 100 may depend on factors such as the inductor current size, input voltage, tracking supply voltage, etc.

It will be appreciated that reverse current may undesirably cause excessive loading on the amplifier 140 and boost converter 110, thereby degrading system efficiency. Furthermore, as a result of the reverse current, the boost converter 110 may need to be significantly over-designed, and/or may cause the linearity and receive (RX) band noise requirements of an output waveform to violate the device specifications. Thus, it would be desirable to provide techniques to minimize such reverse current in an envelope tracking system.

Figure 4:
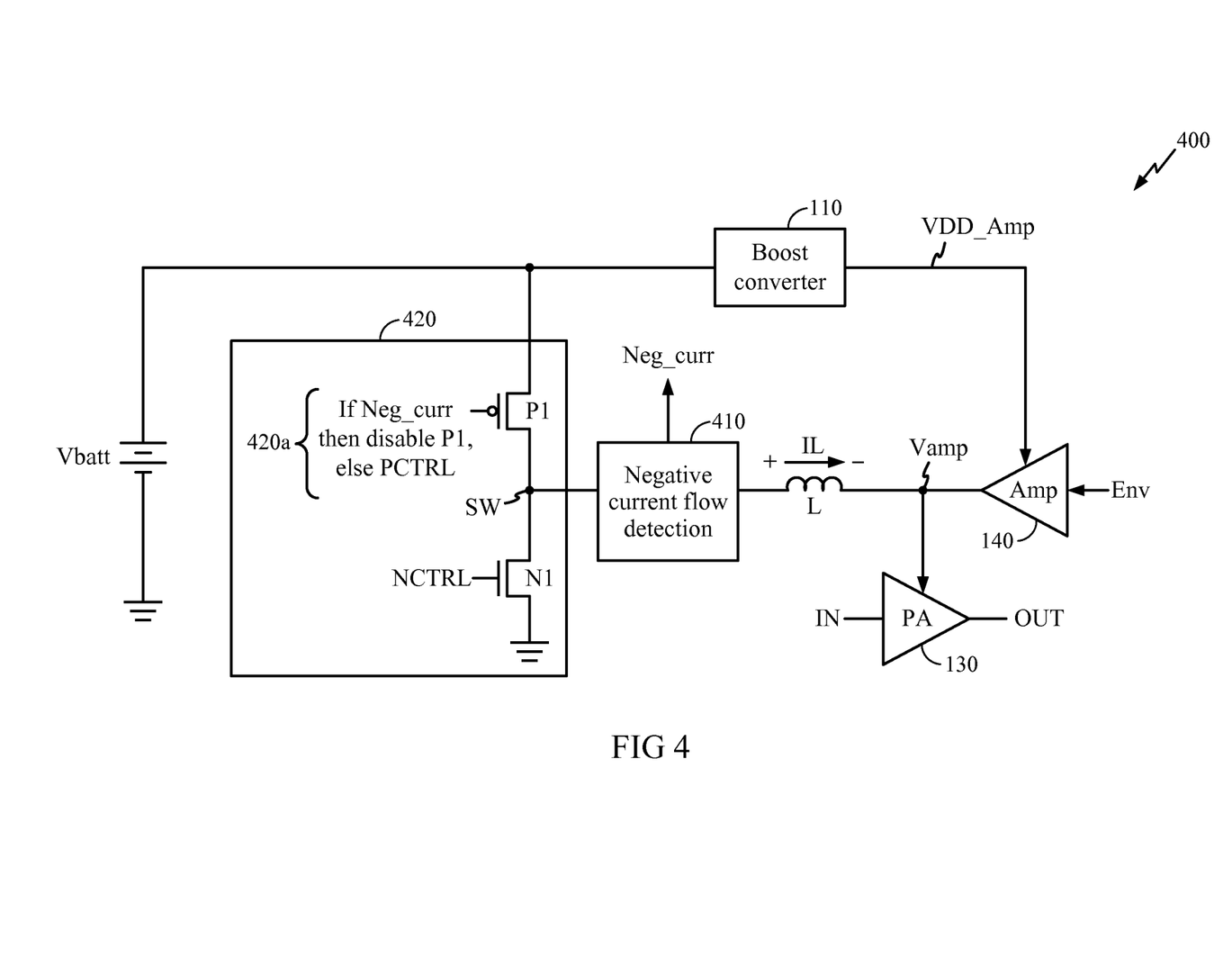
FIG. 4 illustrates an exemplary embodiment of an ET system according to the present disclosure.

FIG. 4 illustrates an exemplary embodiment 400 of an ET system according to the present disclosure. Note FIG. 4 is shown for illustrative purposes only, and is not meant to limit the scope of the present disclosure. Further note that similarly labeled elements in FIGS. 1 and 4 may be understood to perform similar functionality, unless otherwise noted, and their description may be omitted hereinbelow for simplicity.

In FIG. 4, a negative current flow detection block 410 is provided in series between the inductor L and a switching node SW of a modified buck controller 420. Block 410 is configured to detect when IL is negative, i.e., flows from the inductor L back to the switching power stage 420, corresponding to reverse current. Block 410 generates a logical signal Neg_curr which indicates when IL is negative. In the switching power stage 420, switch P1 is controlled by a logical condition labeled 420a. In particular, according to condition 420a, if Neg_curr is logically high, i.e., negative IL is detected by block 410, then switch P1 is disabled. Otherwise, switch P1 is controlled by PCTRL.

It will be appreciated that by disabling switch P1 when negative IL is detected, P1 may be shut down to prevent reverse current from flowing in the ET system 400. Note while an exemplary condition 420a is shown in FIG. 4, other exemplary embodiments may utilize conditions that similarly depend on detected negative current. For example, to avoid false tripping, P1 may instead be disabled when negative current is detected and when the tracking supply voltage exceeds the battery supply voltage. In light of the present disclosure, various other types of logical conditions depending on detected negative current may be applied to make the switch control more robust, and such alternative exemplary embodiments are contemplated to be within the scope of the present disclosure.

Furthermore, while various exemplary embodiments are described herein with reference to "negative current flow detection," alternative exemplary embodiments may also apply similar techniques (e.g., of disabling P1) when a low level of positive current IL is detected. For example, by disabling P1 when either low positive IL or negative IL detected, reverse current flow may be advantageously prevented in the ET system. Accordingly, while references to "negative current flow detection" are made herein, it will be appreciated that all techniques disclosed herein may also be readily applied to detection of negative current flow and low positive current flow. Such alternative exemplary embodiments are contemplated to be within the scope of the present disclosure.

Note various circuit design techniques for designing the negative current flow detection block 410 are known in the art, e.g., a series resistor may be provided and negative voltage drop across the resistor may be sensed, etc. Furthermore, logical circuitry for implementing the logical condition 420a may readily be derived by one of ordinary skill in the art. Such exemplary embodiments are contemplated to be within the scope of the present disclosure.

Figure 5:
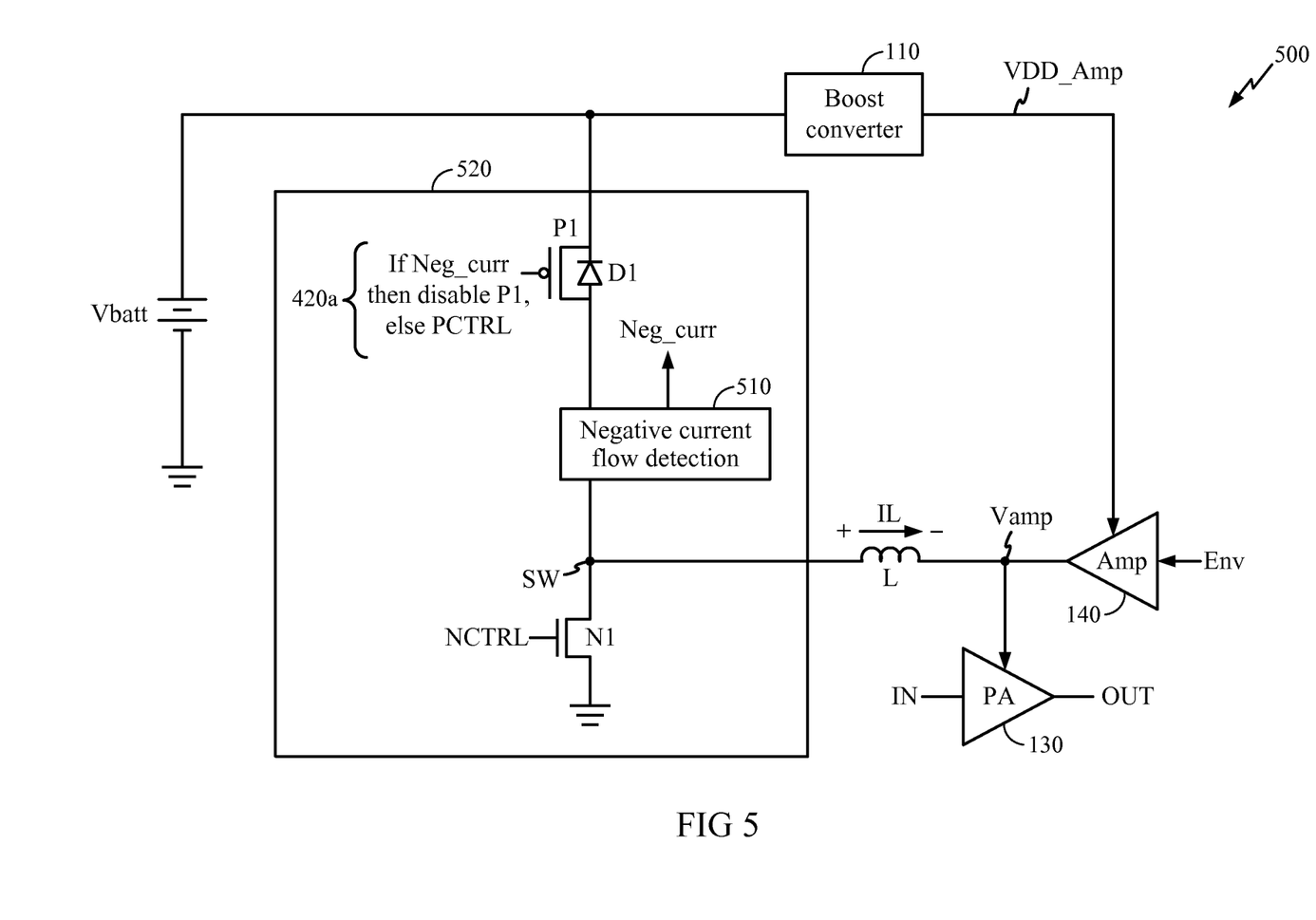
FIG. 5 illustrates an alternative exemplary embodiment of an ET system according to the present disclosure.

FIG. 5 illustrates an alternative exemplary embodiment 500 of an ET system according to the present disclosure. Note FIG. 5 is shown for illustrative purposes only, and is not meant to limit the scope of the present disclosure. Further note that similarly labeled elements in FIGS. 4 and 5 may be understood to perform similar functionality, unless otherwise noted, and their description may be omitted hereinbelow for simplicity.

In FIG. 5, a negative current flow detection block 510 is provided in series between the switching node SW of modified buck controller 520 and Vbatt. Block 510 is configured to detect when IL is negative, i.e., flows from the inductor L back through the switching power stage 520 to Vbatt in a manner similar to that described with reference to block 410 in FIG. 4. Block 510 generates a logical signal Neg_curr which indicates when IL is negative. In the switching power stage 520, switch P1 is also controlled by the logical condition 420a.

Figure 6:
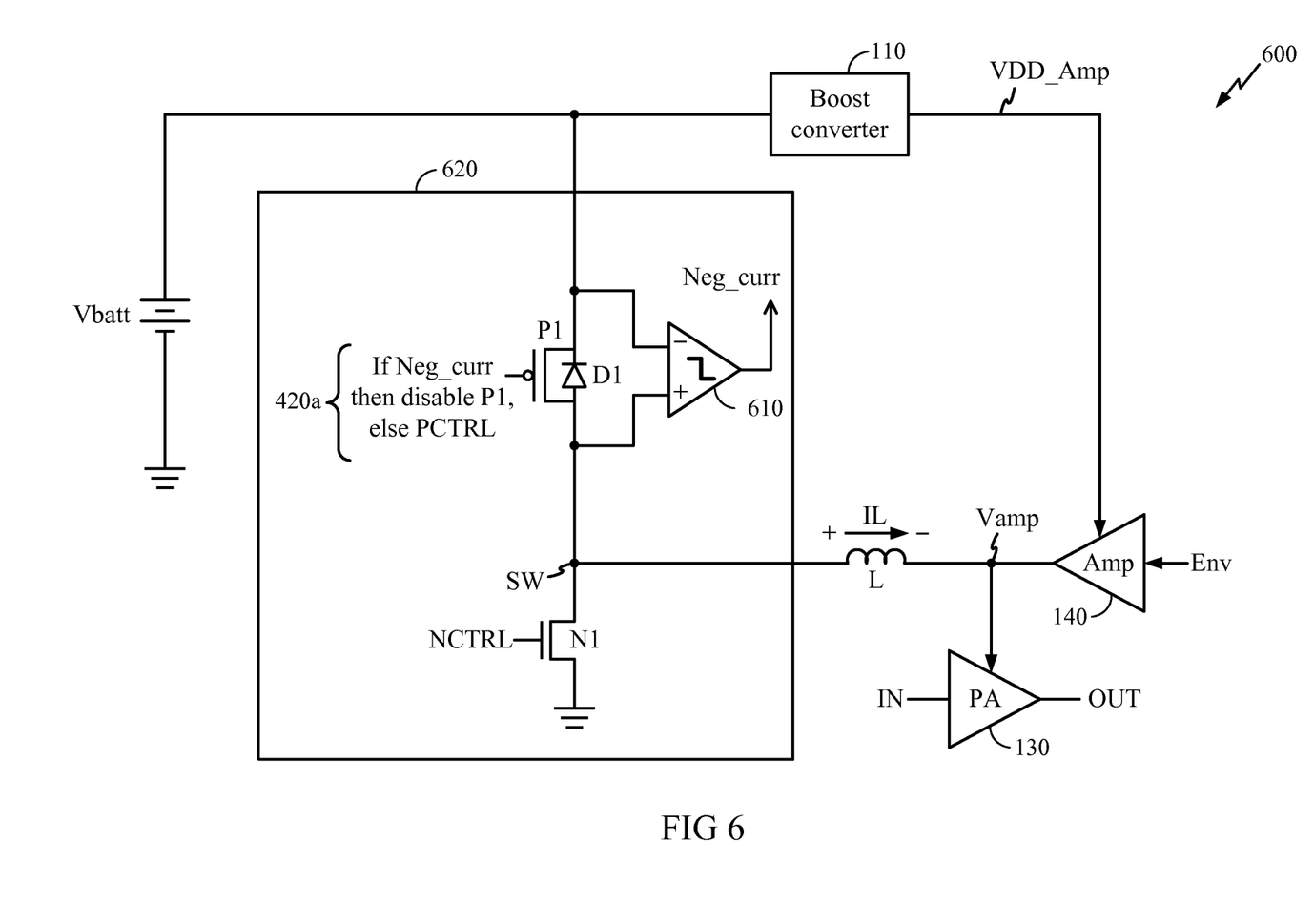
FIG. 6 illustrates an alternative exemplary embodiment of an ET system according to the present disclosure, wherein a voltage sensor is provided to detect negative current flow.

FIG. 6 illustrates an alternative exemplary embodiment 600 of an ET system according to the present disclosure, wherein a voltage sensor is provided to detect negative current flow. Note FIG. 6 is shown for illustrative purposes only, and is not meant to limit the scope of the present disclosure. Further note that similarly labeled elements in FIGS. 5 and 6 may be understood to perform similar functionality, unless otherwise noted, and their description may be omitted hereinbelow for simplicity.

In FIG. 6, a voltage comparator 610 of the modified switching power stage 620 includes a positive (+) input terminal coupled to the drain of P1, and a negative (−) input terminal coupled to the source of P1. Upon negative current (e.g., current in the direction from the drain to the source of P1) being present in P1, a positive voltage drop will appear across the +, − terminals of voltage comparator 610. It will be appreciated that the positive voltage drop may be due to, e.g., finite on-resistance of P1. Upon detecting the positive voltage drop, voltage comparator 610 will generate a high value for Neg_curr at its output. Neg_curr may be used to control the switching of P1 via logical condition 420a, as earlier described hereinabove.

It will be appreciated that by providing a voltage comparator 610 to sense the voltage drop inherently present across P1, negative current flow detection may advantageously be performed without adding additional series elements in the current path, as may be required in the exemplary embodiments 400 and 500 shown in FIGS. 4 and 5, respectively. This advantageously avoids generating additional power losses and thereby improves the efficiency of the ET system.

As illustrated in FIG. 6, note that, even when the gate voltage of P1 is configured to turn off P1 (e.g., by applying 0 volts between the gate and source of P1), conduction through P1 may still occur through the body diode D1 present in P1, which would still give rise to reverse current. According to the present disclosure, further techniques are provided to prevent reverse current flow through P1 even when P1 is configured to be turned off.

Figure 7:
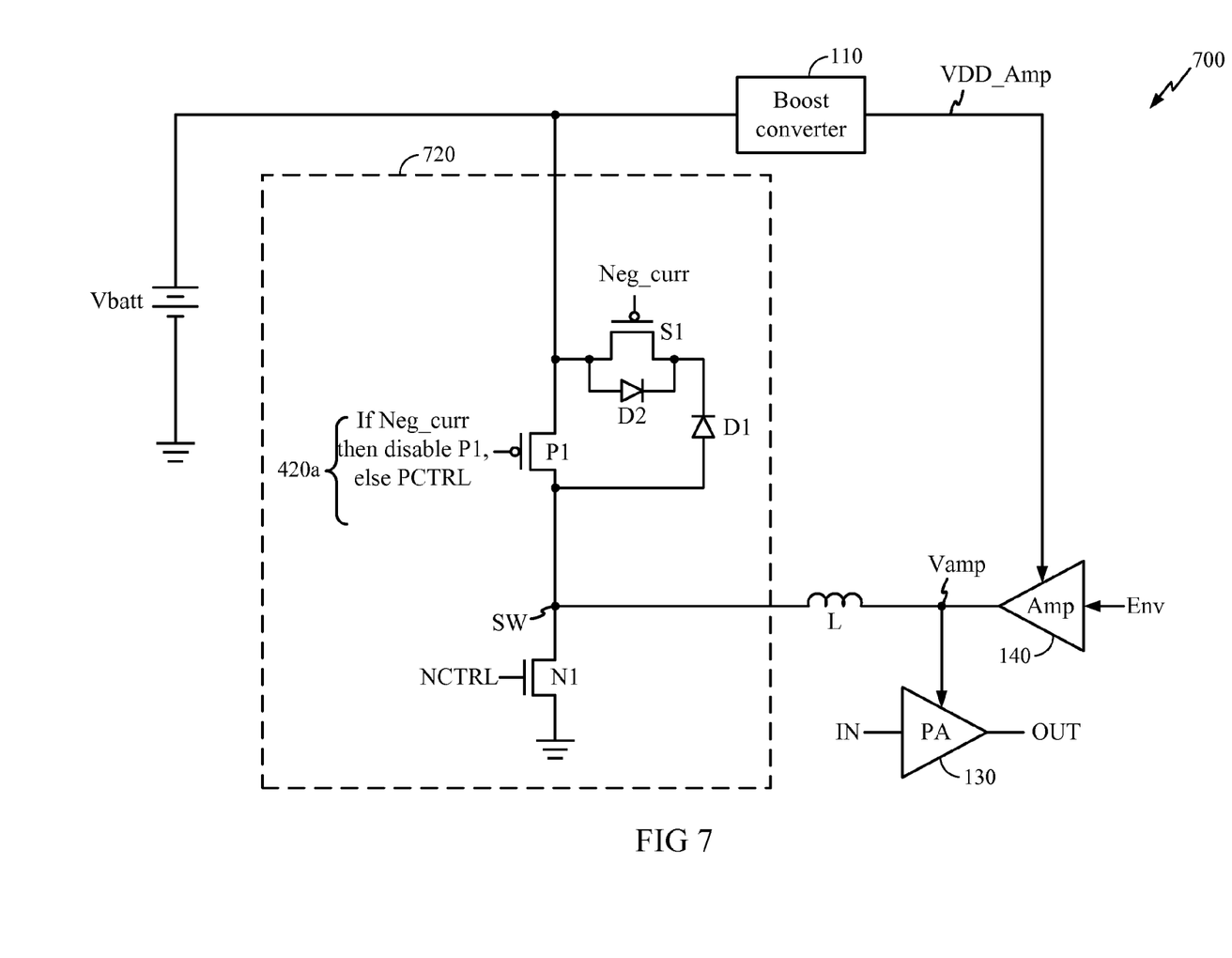
FIGS. 7 and 7A illustrate alternative exemplary embodiments of the present disclosure, wherein further techniques are applied to prevent reverse current flow in an ET system.
Figure 7A:
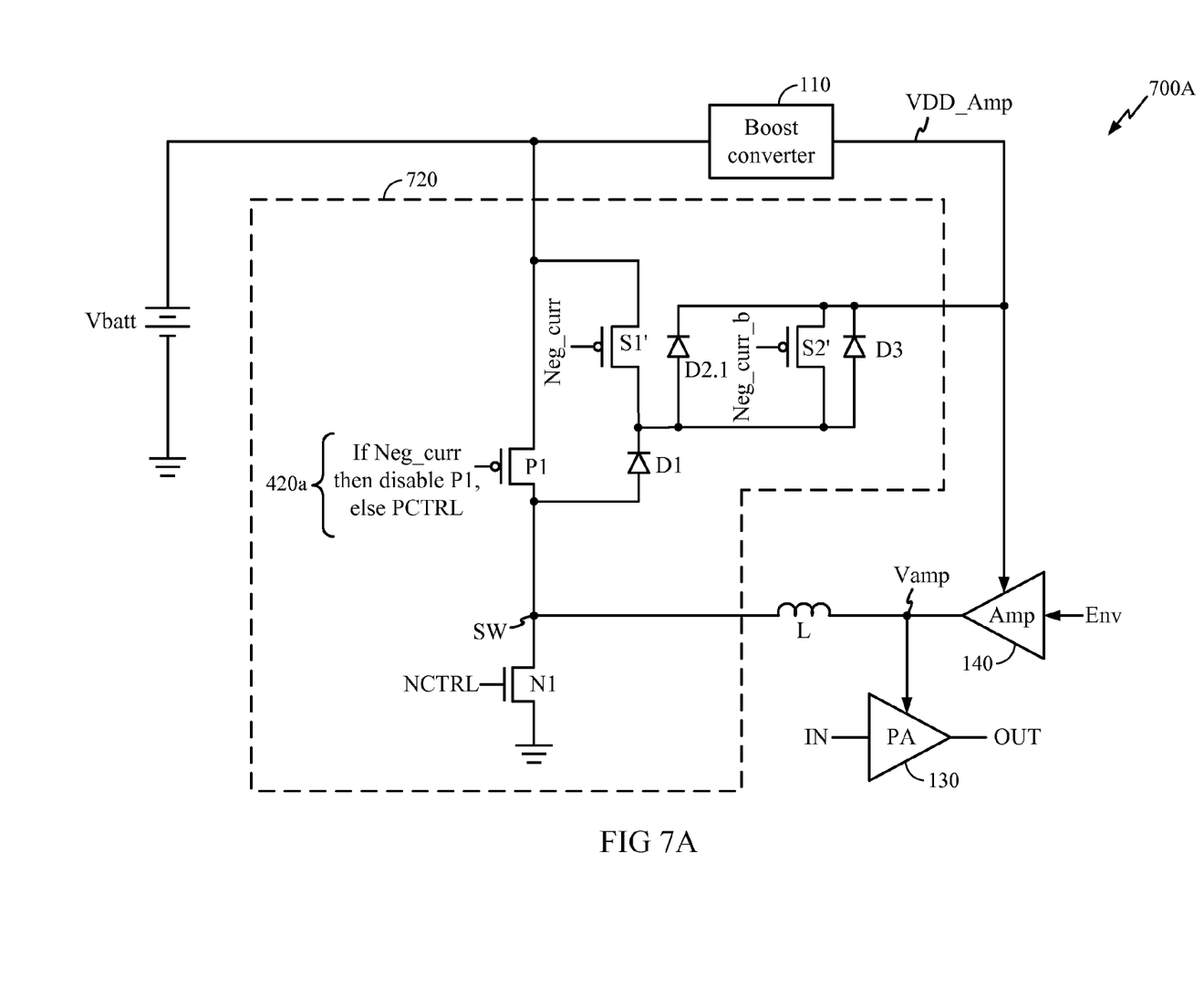

FIGS. 7 and 7A illustrate alternative exemplary embodiments of the present disclosure, wherein further techniques are applied to prevent reverse current flow in an ET system. Note FIGS. 7 and 7A are shown for illustrative purposes only, and are not meant to limit the scope of the present disclosure to exemplary embodiments incorporating the reverse body diodes shown. Note the signal Neg_curr_b corresponds to the logical inverse of Neg_curr. For ease of illustration, the particular means for generating the signal Neg_curr and/or Neg_curr_b is not shown in FIGS. 7 and 7A. One of ordinary skill in the art will nevertheless appreciate that any of the techniques described herein for detecting negative current, e.g., according to exemplary embodiments 400, 500, and 600, in FIGS. 4, 5, and 6, respectively, may be utilized to generate Neg_curr and/or Neg_curr_b for the exemplary embodiments 700 and 700A. Such exemplary embodiments are contemplated to be within the scope of the present disclosure.

In FIG. 7, an auxiliary PMOS switch S1 is provided in series with D1. S1 is configured to be disabled when Neg_curr is high, e.g., when reverse current is detected by a negative current detection block (not shown in FIG. 7). Thus S1 will create an open circuit between D1 and the source of P1 when negative current is detected, and in this manner, negative current through D1 may advantageously be prevented. Note the PMOS switch S1 may itself have a body diode D2, and such body diode D2 may be provided in reverse polarity from D1. In this manner, the polarity of D2 prevents reverse current from flowing through D1 and D2 when S1 is disabled. In an exemplary embodiment, to implement the switch S1 provided in series with D1, an isolated N-well (NWELL) process may be utilized.

In FIG. 7A, a first auxiliary PMOS switch S1' couples the NWELL of P1 with the source of P1, while a second auxiliary PMOS switch S2' couples the NWELL of P1 with VDD_Amp. In an exemplary embodiment, the NWELL's of both S1' and S2' are tied to the boosted voltage VDD_Amp, as illustrated by body diodes D2.1 and D3. The gate of S1' is coupled to Neg_curr, as described hereinabove for the switch S1 of FIG. 7. The gate of S2' is coupled to Neg_curr_b. In particular, when negative current is detected, S2' is turned on to provide a path for current to flow from the node SW to the boosted voltage VDD_Amp. This prevents the voltage at SW from becoming very high, which may potentially cause either D2.1 or N1 to breakdown and be destructive to such devices.

Note in alternative exemplary embodiments, the gates of S1' and S2' need not be controlled by the signals shown; rather, S2' could be always enabled during ET operation. For example, S2' may always be enabled when the ET system 700A is in, e.g., an envelope tracking (ET) mode, while S1' may always be enabled when the ET system 700A is in an average power tracking (APT) mode. In other alternative exemplary embodiments, S2' could be enabled based on negative current detection only when the boost is active, e.g., when there is a potential for a negative current event to occur.

Figure 8:
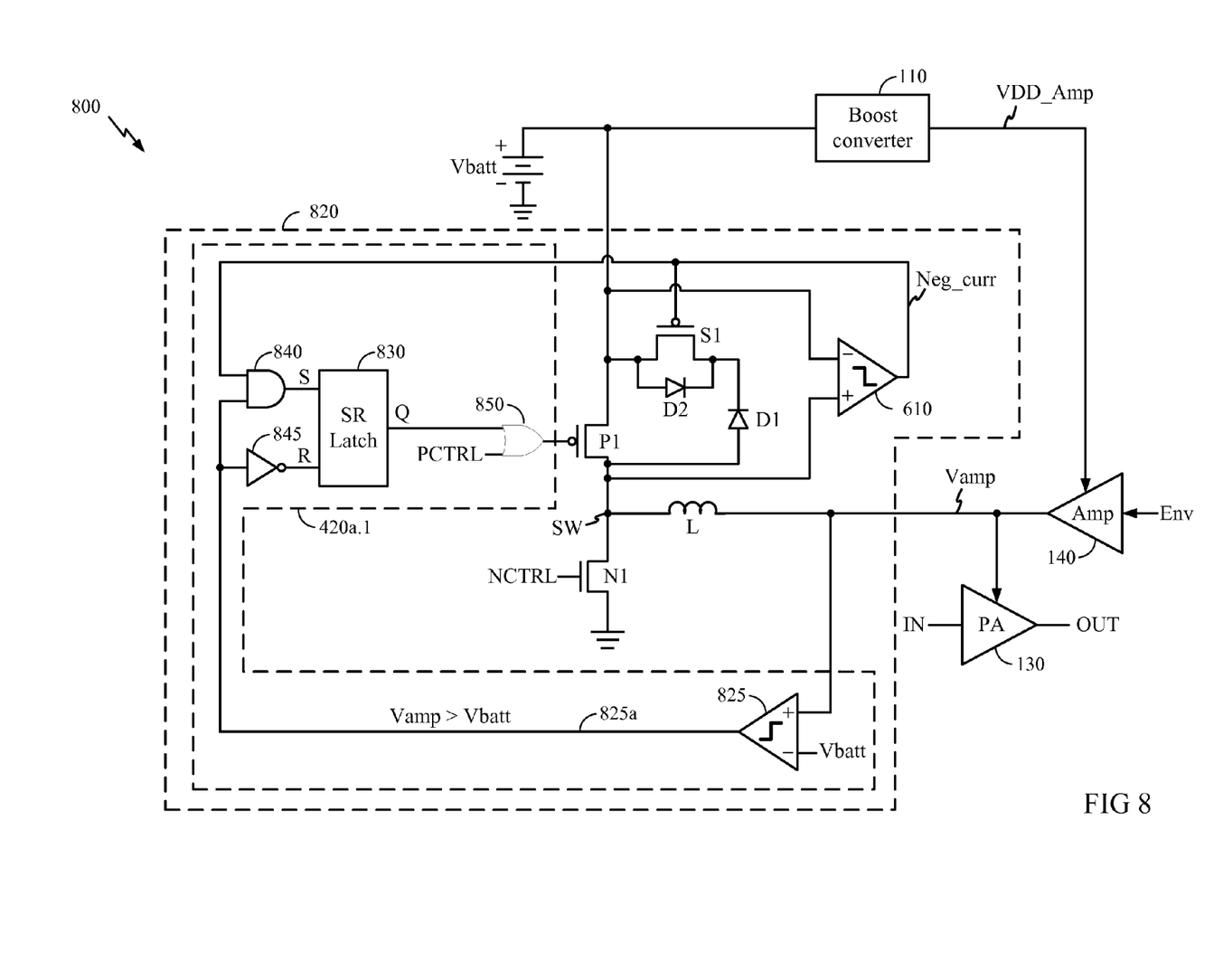
FIG. 8 illustrates an exemplary embodiment 800 of an ET system according to the principles of the present disclosure.

FIG. 8 illustrates an exemplary embodiment 800 of an ET system according to the principles of the present disclosure. Note FIG. 8 is shown for illustrative purposes only, and is not meant to limit the scope of the present disclosure, e.g., to any particular embodiments of a negative current flow detection block, or of blocks for implementing logical conditions. Further note similarly labeled elements in FIGS. 7 and 8 may correspond to elements having similar functionality, unless otherwise noted, and their descriptions may be omitted hereinbelow for simplicity.

In FIG. 8, an exemplary embodiment 820 of the modified switching power stage includes a voltage-comparator-based negative current flow detection block 610 such as described with reference to FIG. 6. In particular, the comparator 610 is also denoted herein as a "first comparator."

The signal voltage Neg_curr is coupled to a logical condition block 420a.1 implementing an enhanced version of the logical condition 420a described with reference to FIGS. 4 and 5. In particular, block 420a.1 includes an SR latch 830. SR latch 830 includes an S input coupled to the output of an AND gate 840 with Neg_curr and a signal 825a as inputs, and an R input coupled to the output of an inverter 845 coupled to the signal 825a as input. The signal 825a is a logical signal indicating whether a condition Vamp>Vbatt is true, i.e., whether Vamp is greater than Vbatt. In the exemplary embodiment shown, 825a is generated by a comparator 825 (also denoted herein as a "second comparator") configured to compare Vamp at its positive (+) terminal to Vbatt at its negative (−) terminal.

Per operation of the circuitry described hereinabove, to prevent false tripping, the second comparator 825 is configured to determine if Vamp>Vbatt. If and only if Vamp>Vbatt, and the inductor current IL is negative, will P1 be disabled, per the functionality of SR latch 830. In an exemplary embodiment, P1 may be re-enabled once Vamp<Vbatt (regardless of the inductor current direction).

In particular, when the R input to SR latch 830 is zero, the Q output will be latched high upon the S input transitioning high. The S input is high whenever Neg_curr is high and Vamp>Vbatt. When the Q output of SR latch 830 is high, then the output of OR gate 850 is high. When the Q output of SR latch 830 is low, then the output of OR gate 850 is PCTRL.

Given the elements described above, it will appreciated that if either input to the OR gate 850 is high, then P1 is disabled. If and only if both inputs to the OR gate 850 are low, will P1 be enabled. If Vamp<Vbatt, then comparator 825a is low, and thus latch 830 will be reset. Reset of latch 830 means the Q output of 830 will be low, thus enabling P1 if PCTRL is low.

In an alternative exemplary embodiment (not shown), the logical condition driving P1 may configure the high-side switch P1 to be re-enabled once a peak in the output voltage waveform (giving rise to the reverse current flow) has passed. In particular, the techniques disclosed herein advantageously allow the envelope tracking amplifier 140 to track a slow waveform, such as the 1RB LTE (1 Resource-Block Long-Term Evolution) waveform, and meet RF requirements in a low-battery configuration without necessarily over-designing the specifications of the boost amplifier.

Note while the exemplary embodiment 800 is described showing a latch 830 and a comparator 825 for generating the signal 825a, it will be appreciated that these elements need not be present in alternative exemplary embodiments. For example, an exemplary embodiment may omit the latch 830 (and associated elements) and comparator 825, and simply rely on the voltage comparator 610 to generate Neg_curr, which disables P1 if Neg_curr is high. Such exemplary embodiments are contemplated to be within the scope of the present disclosure.

Figure 9:
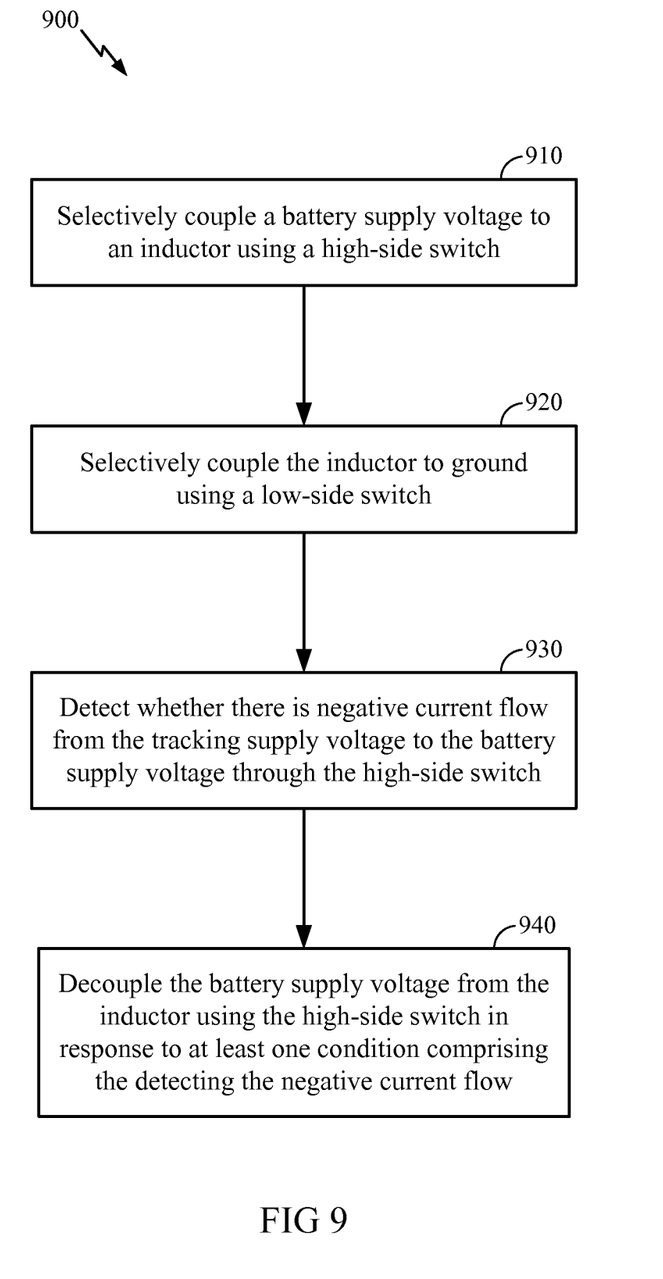
FIG. 9 illustrates an exemplary embodiment of a method according to the present disclosure.

FIG. 9 illustrates an exemplary embodiment of a method 900 according to the present disclosure. Note the method 900 is shown for illustrative purposes only, and is not meant to limit the scope of the present disclosure to any particular method shown.

In FIG. 9, at block 910, a tracking supply voltage is selectively coupled to an inductor using a high-side switch, wherein the inductor is further coupled to a tracking supply voltage.

At block 920, the inductor is selectively coupled to ground using a low-side switch.

At block 930, it is detected whether there is negative current flow from the tracking supply voltage to the battery supply voltage through the high-side switch.

At block 940, the battery supply voltage is decoupled from the inductor using the high-side switch in response to at least one condition comprising the detecting the negative current flow.

In another aspect of the present disclosure, it will be appreciated that, initially, upon the inductor current changing direction (e.g., becoming negative), shutting the switch P1 off will not suddenly stop the inductor current, as it takes time for the inductor current to ramp back toward zero. The inductor current will only increase from a negative value, if the voltage at SW is greater than Vamp. A negative inductor current will charge the parasitic capacitances on SW causing the node voltage to rise. If the voltage at SW (e.g., the drain of P1) becomes more than a threshold voltage (Vt) above Vbatt, which is otherwise used to drive the gate of P1 to turn P1 off, then P1 will start to turn on and conduct reverse current. In this case the "drain" of P1 undesirably becomes the "source" of P1, in a condition also described herein as "reverse conduction."

In an exemplary embodiment, such reverse conduction can be eliminated by driving the gate of P1, e.g., via PCTRL, using VDD_Amp rather than Vbatt, when P1 is intended to be turned off. In this case, VSW would have to rise above Vt above VDD_Amp in order for current to flow through P1 (when it is "off"). It will be appreciated that by driving the gate of P1 using VDD_Amp ensures that P1 stays off during the scenarios described hereinabove.

In an exemplary embodiment, the control voltage PCTRL used to drive the gate of P1 is configured to be as high as VDD_Amp, i.e., the output voltage of the boost converter 110, to turn P1 off. In particular, if the gate of P1 is tied to VDD_SW and VSW goes a threshold voltage (Vt) above VDD_SW then the PMOS P1 will conduct. Therefore, to prevent P1 from conducting the gate of P1 can be pulled up to VDD_Amp.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
 a high-side switch comprising a MOS transistor, the high-side switch coupling a battery supply voltage to an inductor, wherein the inductor is further coupled to a tracking supply voltage;
 a low-side switch coupling the inductor to ground;
 a negative current flow detection block configured to detect negative current flow from the tracking supply voltage to the battery supply voltage through the high-side switch, wherein the high-side switch is configurable to be disabled when negative current flow is detected; and
 a first auxiliary switch in series with a body diode of the MOS transistor, the first auxiliary switch configured to be disabled when negative current flow is detected.

2. The apparatus of claim 1, further comprising a boost converter coupled to the supply voltage to generate a boosted supply voltage higher than the supply voltage.

3. The apparatus of claim 2, the high-side switch comprising a PMOS transistor.

4. The apparatus of claim 2, the high-side switch configured to be turned off by being coupled to the boosted supply voltage.

5. The apparatus of claim 1, the first auxiliary switch comprising an PMOS transistor, the apparatus further comprising a second auxiliary switch coupling an N-well of the high-side switch with the boosted supply voltage, wherein an N_well of the first auxiliary switch is further coupled to the boosted supply voltage.

6. The apparatus of claim 1, a body diode of the first switch being placed in reverse polarity from that of the body diode of the PMOS transistor.

7. The apparatus of claim 1, the negative current flow detection block comprising a first comparator having a negative terminal coupled to the battery supply voltage, and a positive terminal coupled to a terminal of the high-side switch opposite the battery supply voltage.

8. The apparatus of claim 1, further comprising
 a conditional block, the high-side switch being controlled by the conditional logic block configured to generate a signal such that the high-side switch is disabled when negative current is detected and the tracking supply voltage is higher than the battery supply voltage, else the high-side switch is disabled or enabled based on a switching power stage clock signal.

9. The apparatus of claim 8, the conditional logic block comprising an SR latch configured to latch a previous indication that negative current is detected and the tracking supply voltage is higher than the battery supply voltage, wherein the SR latch is reset in response to the tracking supply voltage being lower than the battery supply voltage.

10. The apparatus of claim 1, the high-side switch comprising an NMOS transistor.

11. An apparatus comprising:
a high-side switch coupling a battery supply voltage to an inductor, wherein the inductor is further coupled to a tracking supply voltage;
a low-side switch coupling the inductor to ground;
a negative current flow detection block configured to detect negative current flow from the tracking supply voltage to the battery supply voltage through the high-side switch, wherein the high-side switch is configurable to be disabled when negative current flow is detected; and
a comparator having a positive terminal coupled to the tracking supply voltage and a negative terminal coupled to the battery supply voltage, the high-side switch being further configured to be disabled only if the second comparator output is high and negative current flow is detected.

12. A method comprising:
selectively coupling a battery supply voltage to an inductor using a high-side switch comprising a MOS transistor, wherein the inductor is further coupled to an tracking supply voltage;
selectively coupling the inductor to ground using a low-side switch;
detecting whether there is negative current flow from the tracking supply voltage to the battery supply voltage through the high-side switch;
decoupling the battery supply voltage from the inductor using the high-side switch in response to at least one condition comprising the detecting the negative current flow; and
disabling a switch in series with a body diode of the MOS transistor in response to negative current flow being detected.

13. The method of claim 12, the high-side switch comprising a PMOS transistor.

14. The method of claim 12, the switch in series comprising an auxiliary PMOS transistor, a body diode of the auxiliary PMOS transistor being placed in reverse polarity from that of the body diode of the MOS transistor.

15. The method of claim 12, the detecting the negative current flow comprising detecting a voltage drop from a terminal of the high-side switch opposite the battery supply voltage to the battery supply voltage.

16. The method of claim 12, the at least one condition further comprising detecting that the tracking supply voltage is greater than the battery supply voltage, the decoupling the battery supply voltage being executed only in response to the two conditions being both true.

17. The method of claim 16, further comprising controlling the high-side switch using a switching power stage clock signal if the at least one condition is not met.

18. An apparatus comprising:
means for selectively coupling a battery supply voltage to an inductor using a high-side switch, wherein the inductor is further coupled to an tracking supply voltage, wherein the high-side switch comprises a MOS transistor;
means for selectively coupling the inductor to ground using a low-side switch;
means for detecting whether there is negative current flow from the tracking supply voltage to the battery supply voltage through the high-side switch; and
means for decoupling the battery supply voltage from the inductor using the high-side switch in response to at least one condition comprising the detecting the negative current flow and using a first auxiliary switch in series with a body diode of the MOS transistor, the first auxiliary switch configured to be disabled when negative current flow is detected.

* * * * *